(12) United States Patent
Watanabe

(10) Patent No.: US 7,692,303 B2
(45) Date of Patent: Apr. 6, 2010

(54) SEMICONDUCTOR DEVICE AND MANUFACTURING METHOD THEREOF

(75) Inventor: Takeshi Watanabe, Somers, NY (US)

(73) Assignee: Kabushiki Kaisha Toshiba, Tokyo (JP)

( * ) Notice: Subject to any disclaimer, the term of this patent is extended or adjusted under 35 U.S.C. 154(b) by 26 days.

(21) Appl. No.: 11/802,613

(22) Filed: May 24, 2007

(65) Prior Publication Data

US 2007/0278593 A1  Dec. 6, 2007

(30) Foreign Application Priority Data

May 30, 2006  (JP)  ............................ P2006-150562

(51) Int. Cl.
*H01L 23/52* (2006.01)

(52) U.S. Cl. .................. 257/754; 257/204; 257/206; 257/377; 257/755; 257/769; 438/587; 438/630; 438/655; 438/664; 438/682

(58) Field of Classification Search ................ 257/204, 257/206, 211, E27.046, E27.064, E27.108, 257/E21.632, 377, 382, 388, 412, 413, 754, 257/755, 768, 769, E21.438, E21.622, E21.636; 438/587, 682, 761, 778, FOR. 187, 630, 655, 438/664

See application file for complete search history.

(56) References Cited

U.S. PATENT DOCUMENTS

| | | | |
|---|---|---|---|
| 6,406,743 B1 | 6/2002 | Lee et al. | |
| 6,635,521 B2 * | 10/2003 | Zhang et al. | 438/199 |
| 7,084,061 B2 * | 8/2006 | Sun et al. | 438/685 |
| 7,265,428 B2 * | 9/2007 | Aoyama | 257/413 |
| 2006/0281288 A1 * | 12/2006 | Kawamura et al. | 438/592 |

FOREIGN PATENT DOCUMENTS

JP  2005-129551  5/2005

OTHER PUBLICATIONS

K. Takahashi, et al., "Dual Workfunction Ni-Silicide/HfSiON Gate Stacks by Phase-Controlled Full-Silicidation (PC-FUSI) Technique for 45 nm-node LSTP and LOP Devices", IEDM Tech. Dig., pp. 91-94 (2004).

N. Biswas, et al., "Work function tuning of nickel silicide by co-sputtering nickel and silicon," Applied Physics Letters, vol. 87, p. 171908 (2005).

U.S. Appl. No. 11/526,637, by Yoshinori Tsuchiya et al., filed Sep. 26, 2006, entitled Semiconductor Device and Method for Manufacturing the Same.

* cited by examiner

*Primary Examiner*—N Drew Richards
*Assistant Examiner*—Joannie A Garcia
(74) *Attorney, Agent, or Firm*—Finnegan, Henderson, Farabow, Garrett & Dunner, L.L.P.

(57) ABSTRACT

A semiconductor device includes: a P-type semiconductor layer formed in a surface region of a semiconductor substrate; a first gate insulating film formed on the P-type semiconductor layer; a first gate electrode; and a first source region and a first drain region formed in the P-type semiconductor layer to interpose a region under the first gate electrode in a direction of gate length. The first gate electrode includes: a first silicide film formed on the first gate insulating film and containing nickel silicide having a first composition ratio of nickel to silicon as a main component; a conductive film formed on the first silicide film; and a second silicide film formed on the conductive film and containing nickel silicide having a second composition ratio of nickel to silicon as a main component. The second composition ratio is larger than the first composition ratio.

20 Claims, 7 Drawing Sheets

SEMICONDUCTOR DEVICE AND MANUFACTURING METHOD THEREOF

CROSS-REFERENCE TO RELATED APPLICATIONS

This application is based upon and claims the benefit of priority from Japanese Patent Application No. 2006-150562, filed on May 30, 2006, the entire contents of which are incorporated herein by reference.

BACKGROUND

1. Field

The present invention relates to a semiconductor device, such as an insulated gate field effect transistor, and a manufacturing method thereof.

2. Description of the Related Art

A silicon very large scale integrated circuit is one of the basic technologies supporting a future highly information-oriented society. In order to achieve a high function integrated circuit, it is necessary to obtain high performances of semiconductor devices, such as a MOSFET (Metal-Oxide-Semiconductor Field Effect Transistor), a CMOSFET (Complementary MOSFET), etc., which are elements of the integrated circuit.

High performances of semiconductor elements have been basically accomplished according to a proportional reduction rule. However, in recent years, high performances resulting from ultrafine elements have been difficult to achieve due to various limitations in physical properties.

For example, for a gate electrode using silicon, there have been pointed out the following problems: elicitation of the gate parasitic resistance with an increase in element operation speed, the reduction of the effective insulating film capacitance due to the carrier depletion at the insulating film interface, variations in threshold voltage due to penetration of added impurities into the channel region, and other problems. In order to solve these problems, metal gate materials have been proposed.

As one of the metal gate electrode forming technologies, there is a fully silicide (FUSI) gate electrode technology by which all the gate electrodes are silicided with Ni or Co.

A metal gate electrode requires different work functions according to the conductivity type in order to implement the device operation at an optimum threshold voltage.

This is because the threshold voltage of a MOS transistor is modulated with a change in the work function ($\Phi$eff: effective work function) of the gate electrode at an interface between the gate electrode and gate insulating film.

For example, for the metal gate electrode using nickel silicide ($NiSi_x$), the work function decreases with an increase in composition ratio x. Thus, such a metal gate electrode is suitable for an N-channel MOS transistor.

On the other hand, the work function increase with a decrease in composition ratio x. Thus, such a metal gate electrode is suitable for a P-channel MOS transistor.

For this reason, when a CMOS transistor is manufactured, it is necessary to form $NiSi_x$ having different composition ratios x for the N-channel MOS transistor and the P-channel MOS transistor, respectively.

In addition, conductivity of $NiSi_x$ differs depending on the composition ratio x. Therefore, the gate resistance increases depending upon the composition ratio x of $NiSi_x$ used in the gate electrode.

In contrast, JP-A-2005-129551 discloses a semiconductor device prepared in the following manner: using $NiSi_x$ of the same composition for the N-channel MOS transistor and the P-channel MOS transistor; and adding an N-type impurity to the $NiSi_x$ of the N-channel MOS transistor, and also adding a P-type impurity to the $NiSi_x$ of the P-channel MOS transistor.

As a result of this, nickel silicide gate electrodes having different work functions are formed for the N-channel MOS transistor and the P-channel MOS transistor, respectively.

However, the semiconductor device disclosed in JP-A-2005-129551 requires adding the impurity with a high concentration (1E20 atoms/$cm^2$ or more).

In addition, if an insulating film higher in dielectric constant than a silicon oxide film is used for the gate insulating film, even though an impurity is added, an effect of adjusting the work function does not obtained.

SUMMARY

According to a first aspect of the invention, there is provided a semiconductor device including: a P-type semiconductor layer formed in a surface region of a semiconductor substrate; a first gate insulating film formed on the P-type semiconductor layer; a first gate electrode including a first silicide film formed on the first gate insulating film and containing nickel silicide having a first composition ratio of nickel to silicon as a main component, a conductive film formed on the first silicide film, and a second silicide film formed on the conductive film and containing nickel silicide having a second composition ratio of nickel to silicon which is larger than the first composition ratio as a main component; and a first source region and a first drain region formed in the P-type semiconductor layer to interpose a region under the first gate electrode in a direction of gate length.

According to a second aspect of the invention, there is provided a semiconductor device including: an N-channel insulated gate field effect transistor including: a P-type semiconductor layer formed in a surface region of a semiconductor substrate; a first gate insulating film formed on the P-type semiconductor layer; a first gate electrode including a first silicide film formed on the first gate insulating film and containing nickel silicide having a first composition ratio of nickel to silicon as a main component, a conductive film formed on the first silicide film, and a second silicide film formed on the conductive film and containing nickel silicide having a second composition ratio of nickel to silicon which is larger than the first composition ratio as a main component; and a first source region and a first drain region formed in the P-type semiconductor layer to interpose a region under the first gate electrode in a direction of gate length; and a P-channel insulated gate field effect transistor including: an N-type semiconductor layer formed to be isolated from the P-type semiconductor layer in the surface region of the semiconductor substrate; a second gate insulating film formed on the N-type semiconductor layer; a second gate electrode formed on the second gate insulating film and including a third silicide film containing nickel silicide having the second composition ratio approximately as a main component; and a second source region and a second drain region formed in the N-type semiconductor layer to interpose a region under the second gate electrode in a direction of gate length.

According to a third aspect of the invention, there is provided a method of manufacturing a semiconductor device comprising: forming a P-type semiconductor layer and an N-type semiconductor layer to be isolated from each other in a surface region of a semiconductor substrate; forming a first gate electrode including a first silicon film, a metal film, and a second silicon film stacked in this order on a first gate insulating film formed on the P-type semiconductor layer, and forming a second gate electrode including a third silicon film on a second gate insulating film formed on the N-type semiconductor layer; forming a first source region and a first drain region in the P-type semiconductor layer to interpose a region under the first gate electrode in a direction of gate length, and forming a second source region and a second drain region in the N-type semiconductor layer to interpose a region under the second gate electrode in a direction of gate length; and forming a nickel film on the second silicon film and the third silicon film and then performing a heat treatment to transform the first gate electrode for a transformed first gate electrode including a first silicide film having a first composition ratio of nickel to silicon, a conductive film, and a second silicide film having a second composition ratio of nickel to silicon which is larger than the first composition ratio, and to transform the second gate electrode for a transformed second gate electrode including a third silicide film having the second composition ratio approximately.

DETAILED DESCRIPTION

Embodiments of the invention will be described with reference to the accompanying drawings.

Figure 1:
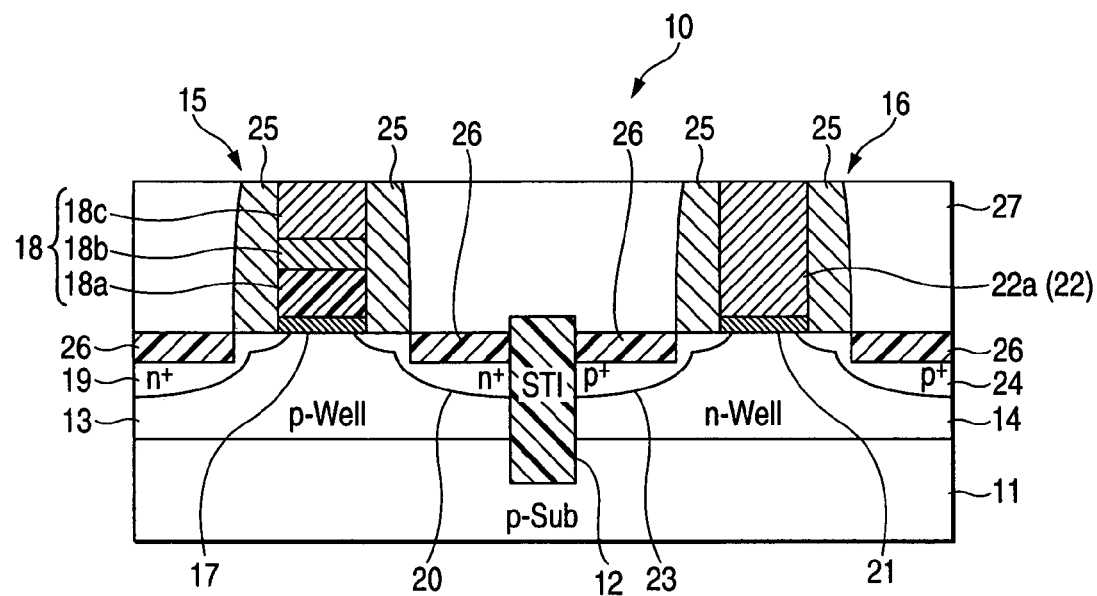
FIG. 1 is a cross sectional view showing a semiconductor device according to an embodiment of the invention.

FIG. 1 is a cross sectional view showing a semiconductor device according to an embodiment of the invention, and FIGS. 2 to 13 are each a cross sectional view showing a manufacturing step of the semiconductor device.

In this embodiment, a CMOS transistor having an N-channel MOS transistor and a P-channel MOS transistor will be explained as an example of the semiconductor device.

As shown in FIG. 1, a semiconductor device 10 of this embodiment includes: a P-type well region (P-type semiconductor layer) 13 and an N-type well region (N-type semiconductor layer) 14 which are formed in a semiconductor substrate such as a P-type silicon substrate 11 and insulated and isolated by a STI (Shallow Trench Isolation) 12; an NMOS transistor 15 formed with the P-type well region 13; and a PMOS transistor 16 formed with the N-type well region 14.

The NMOS transistor 15 includes: a first gate insulating film 17 such as a silicon oxide film; a first gate electrode 18; and a first source region 19 and a first drain region 20 formed in the P-type well region 13 to interpose a region under the first gate electrode 18 in a direction of gate length. The first gate electrode 18 includes: a first silicide film 18a containing $NiSi_2$ as a main component and having a film thickness of, for example, 5 nm; a conductive film 18b including titanium silicide ($TiSi_2$) or titanium silicide and titanium (Ti) in mixture and having a film thickness of, for example, 5 nm; and a second silicide film 18c containing NiSi as a main component, having a film thickness of, for example, 70 nm, which are formed in this order on the first gate insulating film 17. In this embodiment, the "main component" represents a material indicated at a main peak observed in an analysis of an X-ray diffraction method, XPS (X-ray Photoelectron Spectroscopy), etc.

The PMOS transistor 16 includes: a second gate insulating film 21 having a same material and a same film thickness as the first gate insulating film 17; a second gate electrode 22 having a third silicide film 22a containing NiSi as a main component and having a film thickness of, for example, 75 nm on the second gate insulating film 21; and a second source region 23 and a second drain region 24 formed in the N-type well region 14 to interpose a region under the second gate electrode 22 in a direction of gate length.

The both sides of the first gate electrode 18 and the second gate electrode 22 are each covered with sidewall films 25 such as a silicon oxide films.

Silicide films 26 such as nickel silicide for establishing contact with wiring (not shown) are respectively formed on the first source region 19, the first drain region 20, the second source region 23 and the second drain region 24.

The NMOS transistor 15 and the PMOS transistor 16 are covered with a protective film 27.

The first silicide film 18a of the first gate electrode 18 contains $NiSi_2$ with a small work function as a main component, which has a work function of about 4.5 eV. Therefore, with the NMOS transistor 15, by adjusting the substrate impurity concentration, it is possible to obtain the almost same degree of threshold voltage as that of an NMOS transistor having a general poly-silicon gate electrode.

The third silicide film 22a of the second gate electrode 22 contains NiSi with a large work function as a main component, which has a work function of about 4.6 eV. Therefore, with the PMOS transistor 16, by doping boron (B) or fluorine (F) as a substrate impurity, it is possible to obtain the almost same degree of threshold voltage as that of a PMOS transistor having a general poly-silicon gate electrode.

The resistivity of $NiSi_2$ of the first silicide film 18a is about 45 μΩ·cm. It is twice or more as high as about 20 μΩ·cm which is the resistivity of NiSi of the second silicide film 18c.

If the first gate electrode 18 is made entirely of $NiSi_2$, the gate resistance is twice or more higher than the gate resistance of the second gate electrode 22. As a result, the operation of the semiconductor device 10 may be hindered.

Therefore, in order to make uniform the gate resistance values of the first gate electrode 18 and the second gate electrode 22, there arises a necessity of making the height of the first gate electrode 18 larger than that of the second gate electrode 22.

In contrast, in this embodiment, the first gate electrode 18 includes the second silicide film 18c having a relatively large thickness of 70 nm, which is stacked over the first silicide film 18a having a relatively small thickness of 5 nm via the conductive film 18b having a thickness of 5 nm. Therefore, the gate resistance of the first gate electrode 18 can be controlled to be approximately a little higher (+5%) than the gate resistance of the second gate electrode 22.

Therefore, it is possible to make the height of the first gate electrode 18 generally equal to the height of the second gate electrode 22. The thickness of the first silicide film 18a is 5 nm in this embodiment. However, the thickness of the first silicide film 18a may be 3 to 13 nm. It is preferable that the thickness of the first silicide film 18a is equal to or over 3 nm in view of adjusting the work function. In addition, if the thickness of the first gate electrode 18 is of 80 nm and within 10% increase of the gate resistance is allowed, it is preferable the thickness of the first silicide film 18a is equal to or below 13 nm.

Then, a method of manufacturing the semiconductor device 10 will be described in detail with reference to FIGS. 2 to 13.

Figure 2:
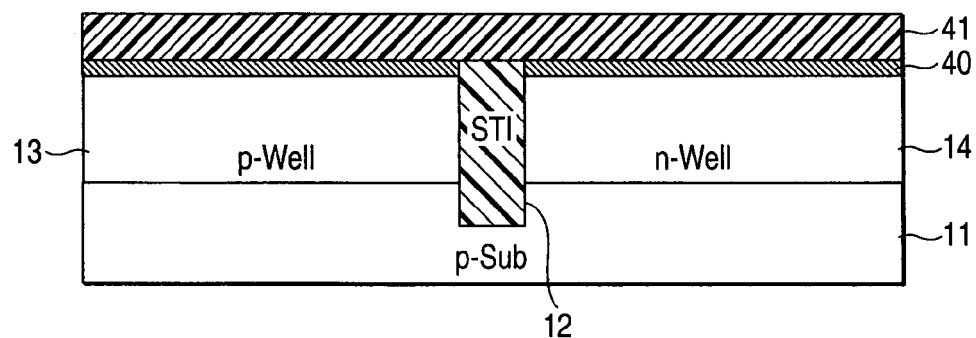
FIG. 2 is a cross sectional view showing a manufacturing process of the semiconductor device according to the embodiment of the invention.

In the beginning, as shown in FIG. 2, the STI 12 is formed by forming a trench in the P-type silicon substrate 11 and embedding an insulating material inside the trench, and the P-type well region 13 and the N-type well region 14, which are electrically isolated by the STI 12, are formed.

Then, on the P-type silicon substrate 11, a silicon oxide film 40 with a thickness of about 1.5 nm is formed by, for example, a thermal oxidation method, and a silicon film 41 with a thickness of about 5 nm is formed by, for example, a CVD (Chemical Vapor Deposition) method.

The silicon oxide film 40 becomes the first gate insulating film 17 and the second gate insulating film 21, and the silicon film 41 becomes the first silicide film 18a and the lower part of the third silicide film 22a.

Figure 3:
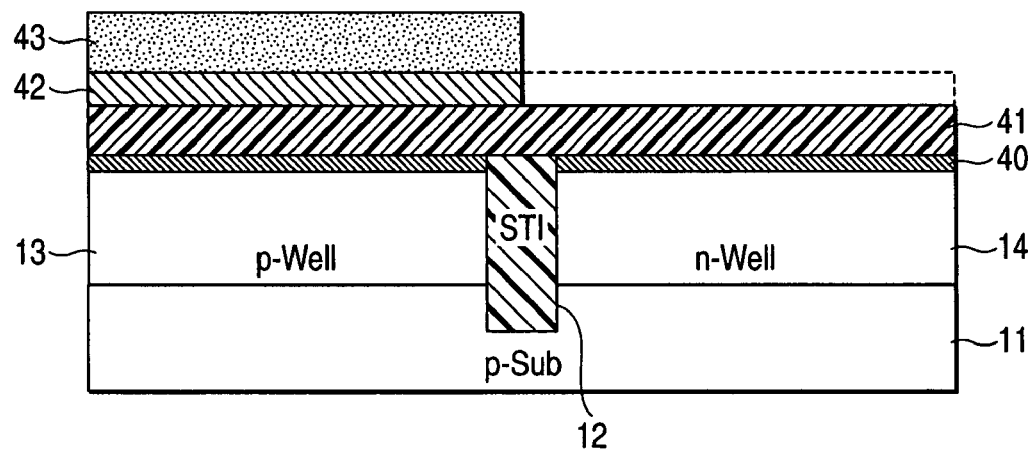
FIG. 3 is a cross sectional view showing a manufacturing process of the semiconductor device according to the embodiment of the invention.

As shown in FIG. 3, a titanium film 42 with a thickness of about 5 nm is formed as a metal film on the silicon film 41 by, for example, a sputtering method.

Then, a resist film 43 is formed above the P-type well region 13 by a photolithography method. By using the resist film 43 as a mask, the titanium film 42 above the N-type well region 14 is etched by the use of, for example, oxygenated water. The titanium film 42 left above the P-type well region 13 becomes the conductive film 18b.

Figure 4:
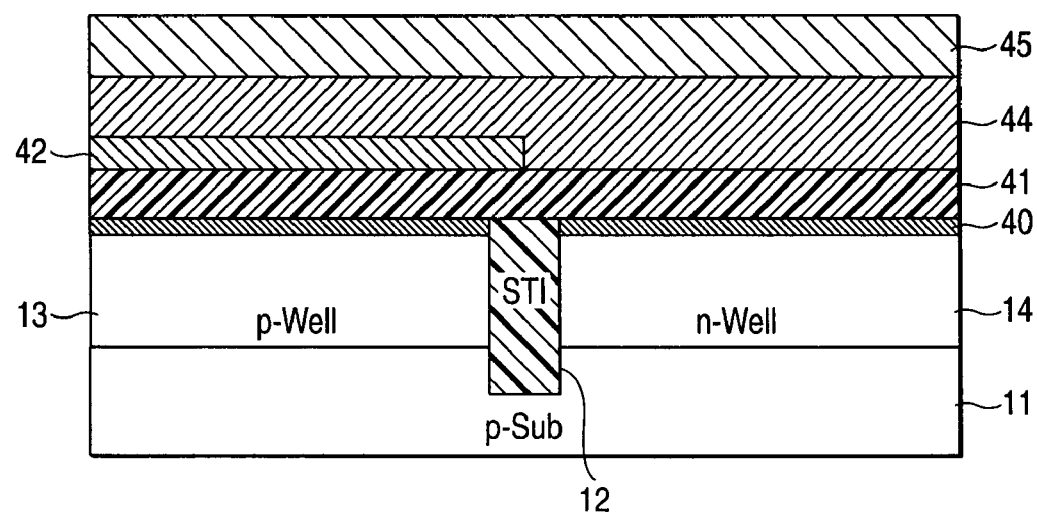
FIG. 4 is a cross sectional view showing a manufacturing process of the semiconductor device according to the embodiment of the invention.

After removing the resist film 43, as shown in FIG. 4, a silicon film 44 having a thickness of about 70 nm is formed above the P-type silicon substrate 11 by, for example, a CVD method. A silicon nitride film 45 having a thickness of about 200 nm is formed on the silicon film 44 by, for example, a plasma CVD method. The silicon film 44 becomes the second silicide film 18c and the upper portion of the third silicide film 22a.

Figure 5:
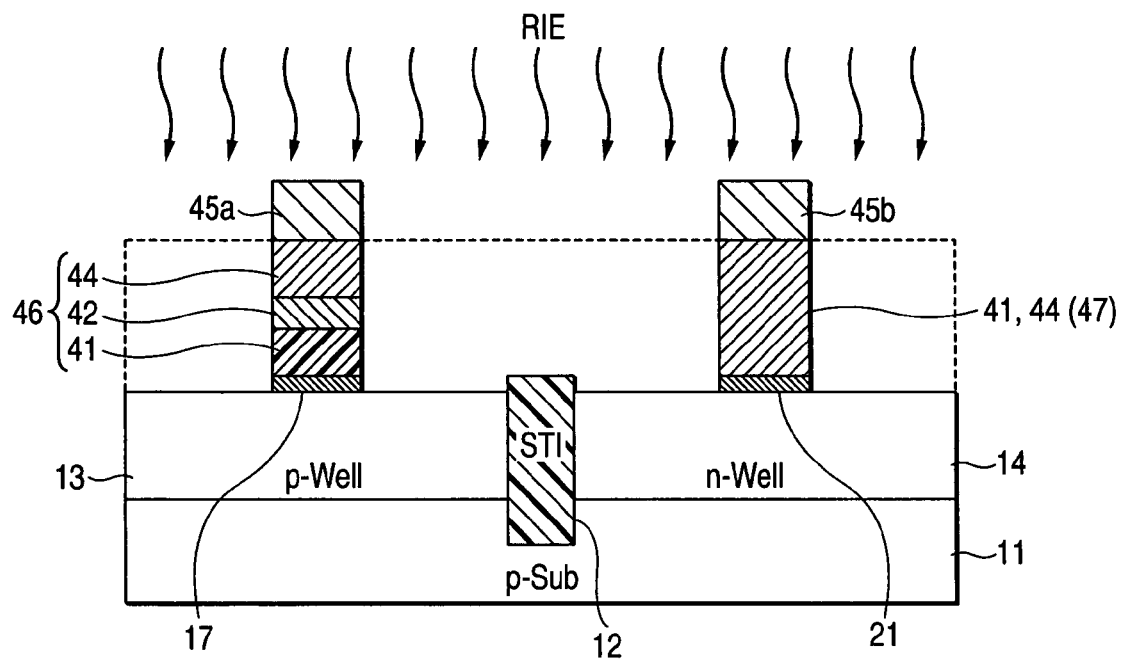
FIG. 5 is a cross sectional view showing a manufacturing process of the semiconductor device according to the embodiment of the invention.

As shown in FIG. 5, the silicon nitride film 45 is processed into gate electrode patterns by a photolithography method. By using the silicon nitride films 45a and 45b each having a gate electrode pattern as masks, the silicon film 44, the titanium film 42, the silicon film 41 and the silicon oxide film 40 are etched by, for example, a RIE (Reactive Ion Etching) method. As a result, the surface of the P-type silicon substrate 11 is exposed.

As a result of this, the first gate electrode 46 is formed on the first gate insulating film 17, and the second gate electrode 47 is formed on the second gate insulating film 21. It is noted that the first gate electrode 46 and the second gate electrode 47 are formed to have substantially the same thicknesses. However, a variation between these thicknesses about the range of the thickness of the titanium film 42 formed as the metal film can be allowed.

Figure 6:
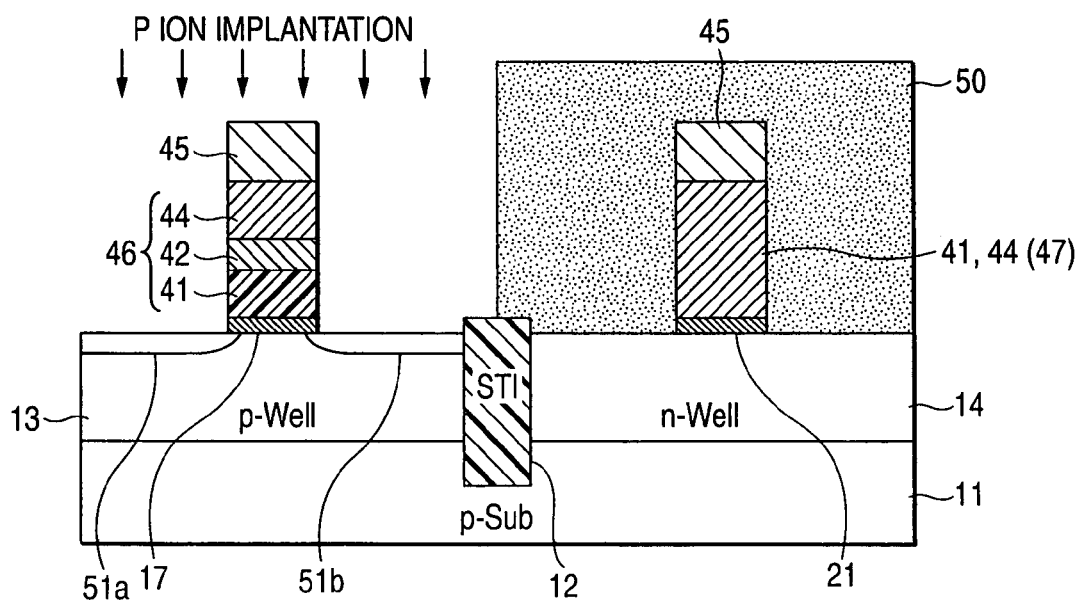
FIG. 6 is a cross sectional view showing a manufacturing process of the semiconductor device according to the embodiment of the invention.

As shown in FIG. 6, the N-type well region 14 is masked with a resist film 50, and then phosphorus (P) is implanted into the P-type well region 13 by, for example, an ion implantation method. Thus, shallow N-type low impurity concentration layers 51a and 51b are formed.

Figure 7:
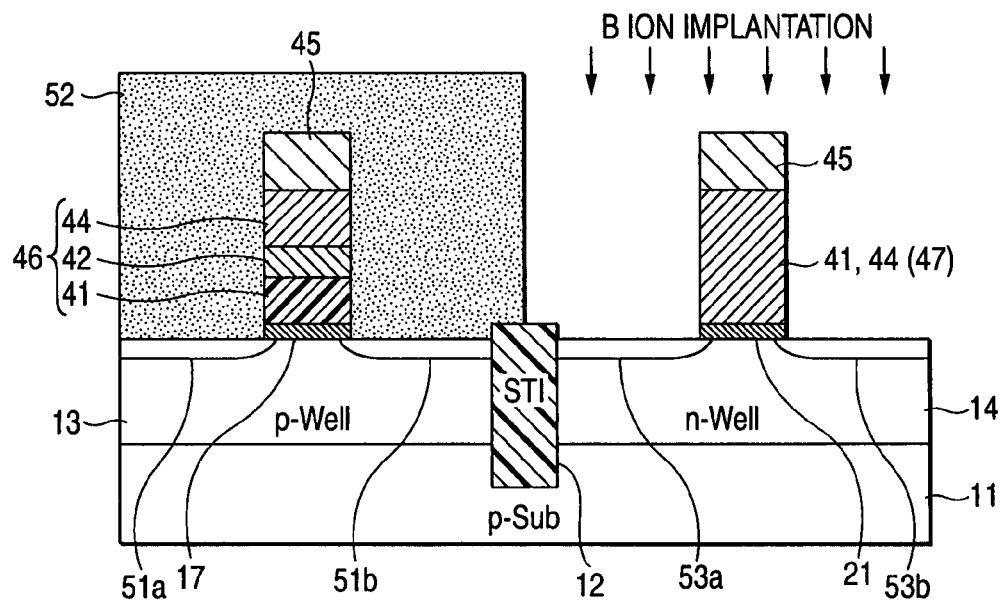
FIG. 7 is a cross sectional view showing a manufacturing process of the semiconductor device according to the embodiment of the invention.

After removing the resist film 50, as shown in FIG. 7, the P-type well region 13 is masked with a resist film 52, and then boron (B) is implanted into the N-type well region 14 by, for example, an ion implantation method. Thus, shallow P-type low impurity concentration layers 53a and 53b are formed.

Figure 8:
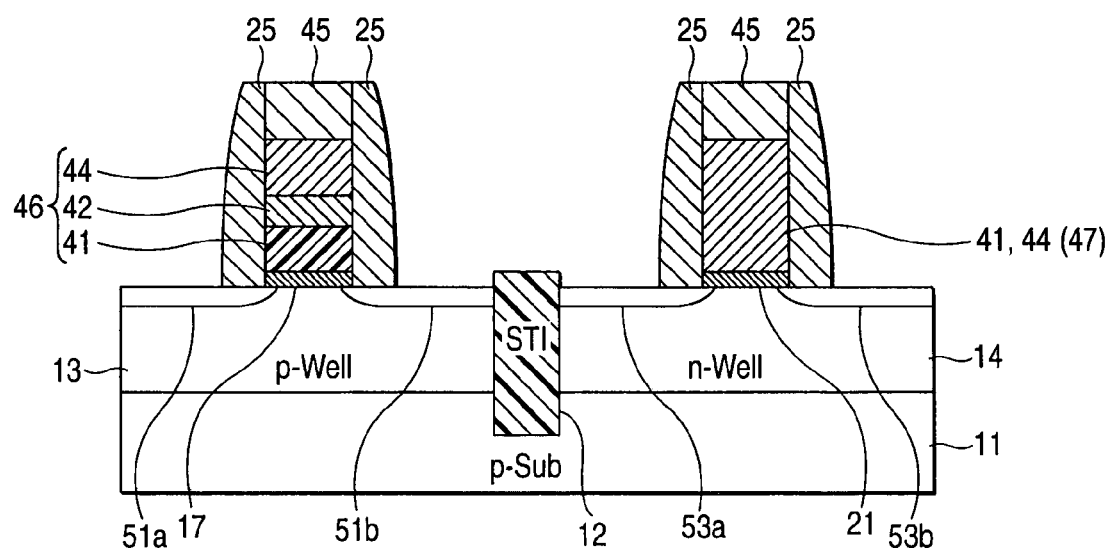
FIG. 8 is a cross sectional view showing a manufacturing process of the semiconductor device according to the embodiment of the invention.

After removing the resist film 52, as shown in FIG. 8, a sidewall film 25, such as a lamination film of a silicon oxide film and a silicon nitride film, is formed on both sides of the first gate electrode 46 and the second gate electrode 47.

Figure 9:
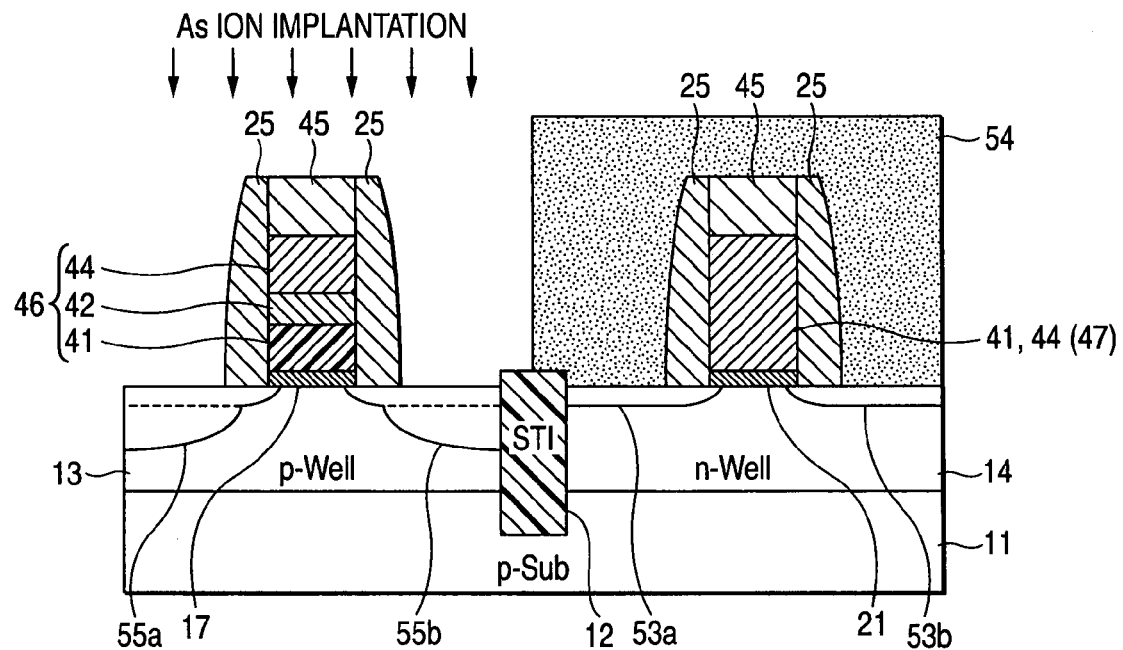
FIG. 9 is a cross sectional view showing a manufacturing process of the semiconductor device according to the embodiment of the invention.

As shown in FIG. 9, the N-type well region 14 is masked with a resist film 54, and then arsenic (As) is implanted into the P-type well region 13 by, for example, an ion implantation method. Thus, N-type high impurity concentration layers 55a and 55b deeper than the N-type low impurity concentration layers 51a and 51b are formed.

Figure 10:
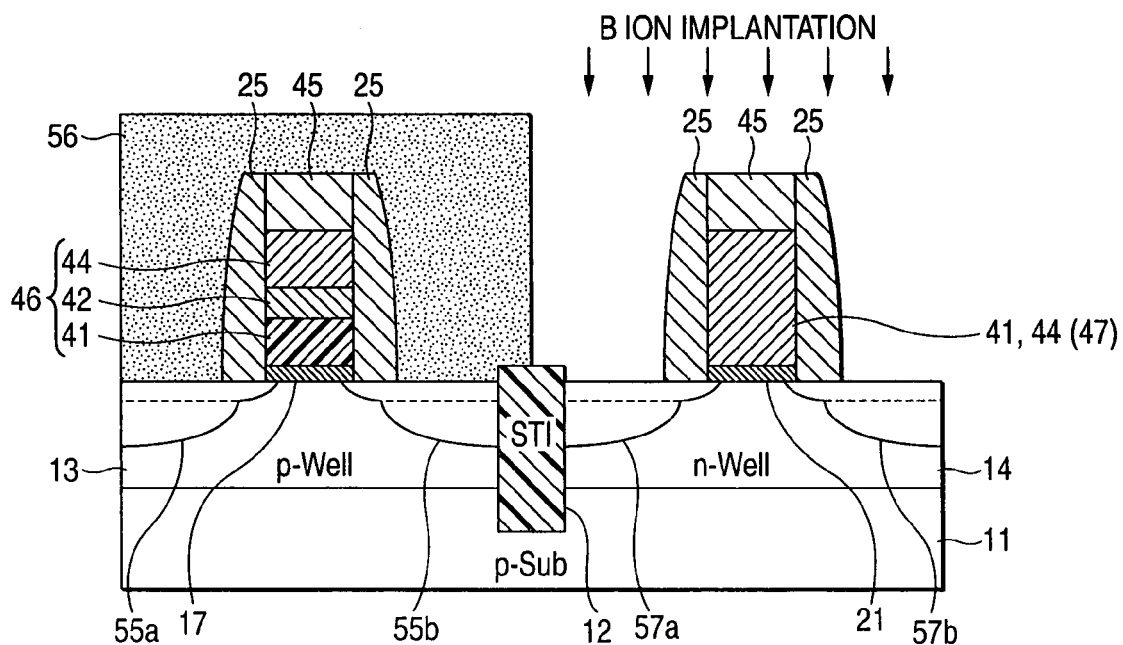
FIG. 10 is a cross sectional view showing a manufacturing process of the semiconductor device according to the embodiment of the invention.

After removing the resist film 54, as shown in FIG. 10, the P-type well region 13 is masked with a resist film 56, and then boron (B) is implanted into the N-type well region 14 by, for example, an ion implantation method. Thus, P-type high impurity concentration layers 57a and 57b deeper than the N-type low impurity concentration layers 53a and 53b are formed.

Figure 11:
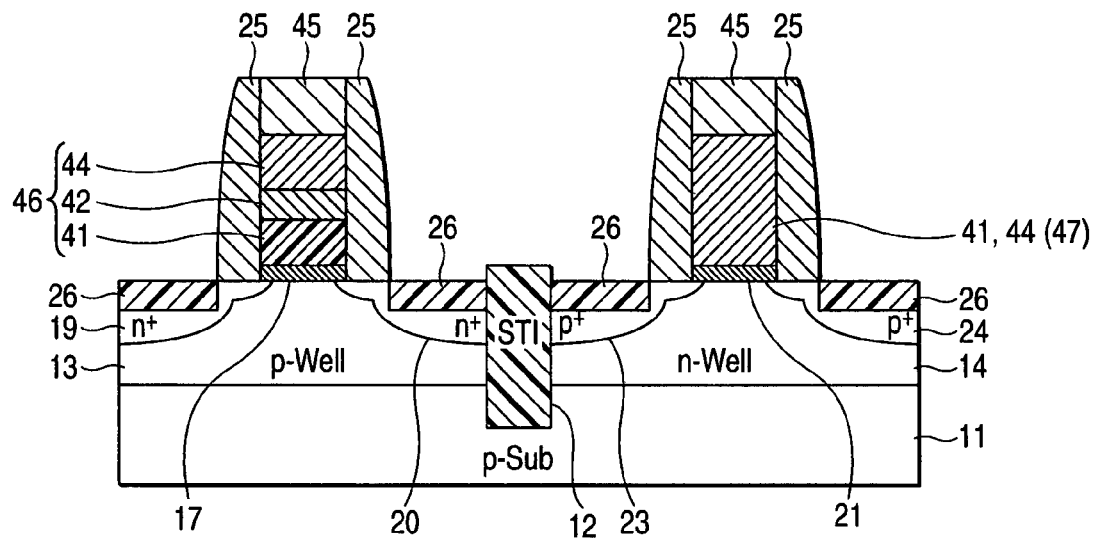
FIG. 11 is a cross sectional view showing a manufacturing process of the semiconductor device according to the embodiment of the invention.

After removing the resist film 56, as shown in FIG. 11, the low impurity concentration layers 51a, 51b, 53a and 53b, and the high impurity concentration layers 55a, 55b, 57a and 57b are electrically activated by a heat treatment. Accordingly, the first source region 19, the first drain region 20, the second source region 23 and the second drain region 24, which have LDD (Lightly Doped Drain) structures, are formed.

Then, a nickel (Ni) film is formed on the first source region 19, the first drain region 20, the second source region 23 and the second drain region 24, by, for example, a sputtering method, and then the nickel film is subjected to a heat treatment to form a silicide film 26 of NiSi.

Figure 12:
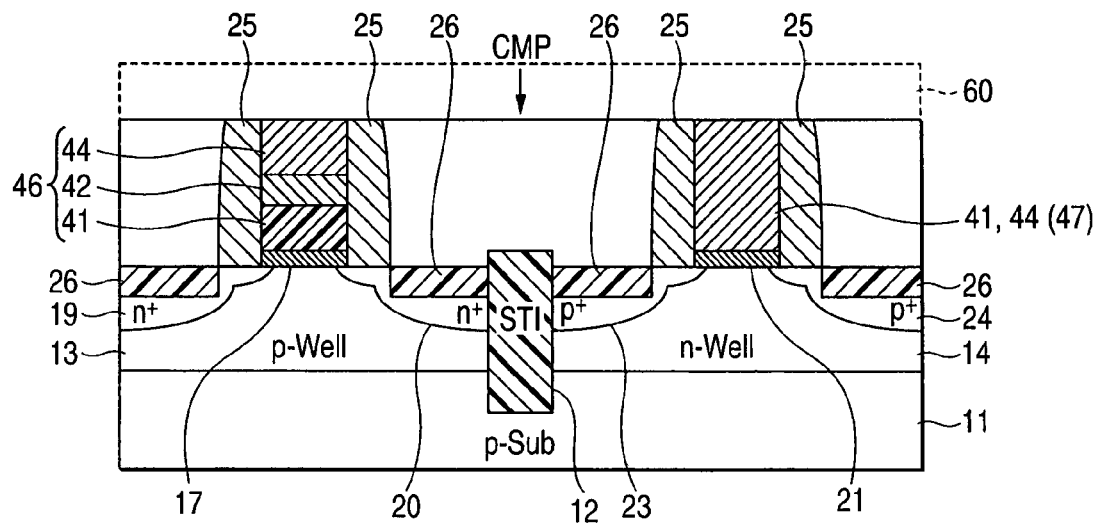
FIG. 12 is a cross sectional view showing a manufacturing process of the semiconductor device according to the embodiment of the invention.

As shown in FIG. 12, an insulating film, for example, a TEOS (Tetra Ethyl Ortho Silicate) film 60 is formed by a CVD method on a region including the entire surface of the P-type silicon substrate 11, the first gate electrode 46 and the second gate electrode 47. The TEOS film 60 is polished with a CMP (Chemical Mechanical Polishing) method until the surfaces of the first gate electrode 46 and the second gate electrode 47 are exposed. The left TEOS film 60 becomes a protective film 27.

Figure 13:
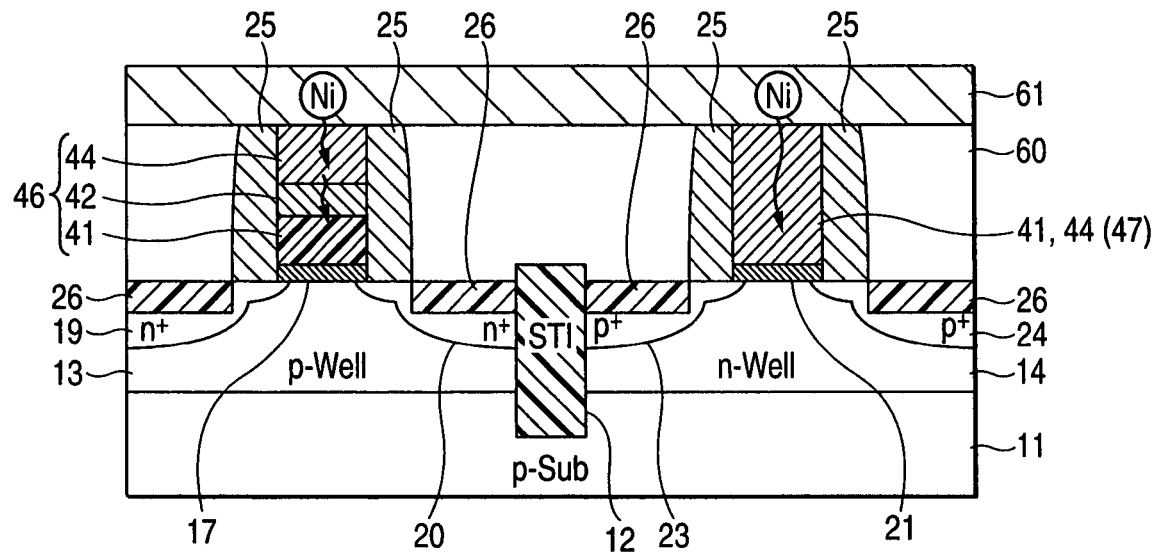
FIG. 13 is a cross sectional view showing a manufacturing process of the semiconductor device according to the embodiment of the invention.

As shown in FIG. 13, a nickel (Ni) film 61 with a thickness of about 30 nm is formed on a region including the protective film 27, the first gate electrode 46 and the second gate electrode 47 by, for example, a sputtering method.

Then, in order to prevent oxidation of the nickel film 61, nickel (Ni) is diffused into the silicon films 41 and 44 in an inert gas atmosphere with a RTA (Rapid Thermal Annealing) method at 450° C.

As a result of this, the nickel (Ni) diffused in the silicon film 44 of the first gate electrode 46 undergoes solid phase reaction with silicon to form the second silicide film 18c containing NiSi as a main component.

Similarly, the nickel (Ni) diffused in the silicon films 41 and 44 of the second gate electrode 47 undergoes solid phase reaction with silicon to form the third silicide film 22a containing NiSi as a main component.

On the other hand, the nickel (Ni), which has been diffused into the silicon film 44 of the first gate electrode 46 and has reached the titanium (Ti) film 42, has been mostly blocked by the titanium (Ti) film 42. Accordingly, only a part of the Ni can pass through the titanium (Ti) film 42 to be diffused into the silicon film 41.

As a result, the solid phase reaction of the nickel (Ni) diffused into the silicon film 41 and silicon is effected based on the Ni feed rate, and sufficient Ni is not fed into the silicon film 41. Therefore, the first silicide film 18a containing $NiSi_2$ as a main component is formed.

A test sample was formed under the same conditions, and the diffraction profile was examined by an X-ray diffraction method. This indicated as follows: a main diffraction peak was observed at the diffraction angle (2θ: 47°) of $NiSi_2$ for the first silicide film 18a; and the main diffraction peak was observed at the diffraction angle of NiSi for the second and third silicide films 18c and 22a.

Further, it was indicated that $NiSi_2$ was formed even at a heat treatment temperature by a RTA method of as low as about 350° C.

The analysis of other diffraction peaks indicated as follows: although the formation temperature of titanium silicide is higher than the formation temperature of nickel silicide, the reaction between the titanium film 42 and the silicon films 41 and 44 was effected, and titanium silicide ($TiSi_2$) was also formed.

Then, the unreacted nickel layer 61 left on the surface of the P-type silicon substrate 11 is removed by, for example, a CMP method. Then, an interlayer insulating film, wiring, contacts and the like (not shown) are formed, and the semiconductor device is obtained shown in FIG. 1.

Figure 14:
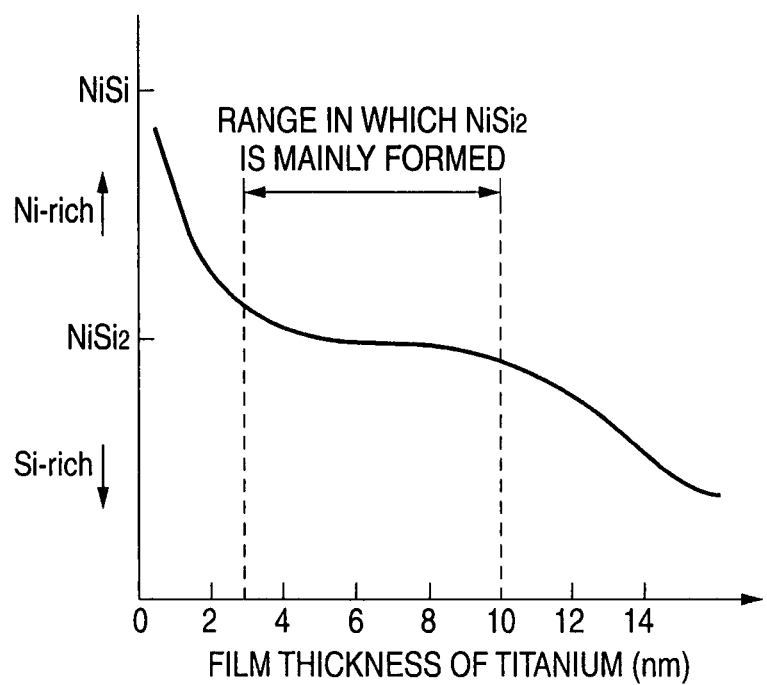
FIG. 14 is a schematic diagram showing the relationship between the film thickness of a titanium film and a silicide film according to the embodiment of the invention.

FIG. 14 is a schematic diagram showing the relationship between the film thickness of the titanium film 42 and the first silicide film 18a. As shown in FIG. 14, when the titanium film 42 is thin, most of nickel passes through the titanium film 42, and nickel is fed in excess into the silicon film 41. As a result, the composition ratio x of $NiSi_x$ becomes small (Ni composition ratio becomes large), resulting in a Ni-rich silicide film.

On the other hand, when the titanium film 42 is thick, most of nickel cannot pass through the titanium film 42, resulting in a nickel feed rate. Accordingly, nickel is not fed in excess into the silicon film 41. As a result, the composition ratio x of $NiSi_x$ becomes large (Ni composition ratio becomes small), resulting in a Si-rich silicide film.

According to the experiment, when the heat treatment temperature by a RTA method was 450° C., and the film thickness of the nickel film 61 was 1.7 times or more the sum of film thicknesses of the silicon films 41 and 44 and the film thickness of the titanium film 42 was about 3 to 10 nm, the first silicide film 18a containing $NiSi_2$ as a main component was formed until it reached immediately on the first gate insulating film 17.

The film thickness of the titanium film 42 is preferably smaller in terms of the gate resistance of the first gate electrode 18. Accordingly, it is properly about 5 nm.

This enables the easy formation of silicide gate electrodes different in work function and generally equal in gate resistance between the NMOS transistor 15 and the PMOS transistor 16 with the same process.

As described above, the NMOS transistor 15 of the semiconductor device 10 of this embodiment includes: the first gate electrode 18 formed on the gate insulating film 17 and having the first silicide film 18a containing $NiSi_2$ low in work function as a main component; and the second silicide film 18c formed on the conductive film 18b and above the first silicide film 18a and containing NiSi low in resistance as a main component.

As a result, it is possible to obtain the optimum threshold voltage at the NMOS transistor 15 and the PMOS transistor 16. In addition, it is possible to obtain a CMOS transistor having silicide gate electrodes having a generally equal gate resistance.

Namely, it is possible to implement a semiconductor device having silicide gate electrodes which have been controlled in work function and are low in gate resistance, and a manufacturing method thereof.

Herein, a description has been given to the case where the heat treatment temperature by a RTA method was 450° C. However, even at a further lower temperature, for example, at about 350° C., it is possible to form $NiSi_2$. Thus, it does not matter even if the heat treatment temperature is set lower. A lower heat treatment temperature has an advantage of suppressing the aggregation of the silicide film 26.

In the above embodiment, an example is stated that the second silicide film 18c and the third silicide film 22a are NiSi. However, $Ni_3Si$, $Ni_{31}Si_{12}$ or $Ni_2Si$ can also be used for the second silicide film 18c and the third silicide film 22a.

This has an advantage of being suitable for the gate electrode of the PMOS transistor because the work function increases with an increase in Ni composition ratio.

Further, an example is stated that the metal film is titanium (Ti) in the above embodiment. However, metals such as tungsten (W), hafnium (Hf) and ruthenium (Ru) may be formed with a film thickness of 3 to 10 nm. Further, an alloy of at least two metals of Ti, W, Hf and Ru may also be used.

Still further, an example is stated that the first and second gate insulating films 17 and 21 are each a silicon oxide film. However, there is no necessity that an impurity is doped into the first electrode 18 and second gate electrode 22. Therefore, a film having a larger dielectric constant than that of the silicon oxide film such as a silicon oxynitride film (SiON), a hafnium oxide film ($HfO_2$), a hafnium silicon oxide film (HfSiO), a hafnium silicon oxynitride film (HfSiON), a hafnium aluminum oxide film (HfAlO) or a hafnium aluminum oxynitride film (HfAlON) may also be used for the gate insulating film.

For example, the hafnium silicon oxynitride film (HfSiON) may be formed in the following manner. On the P-type silicon substrate 11, a hafnium silicon oxide film ($HfSiO_4$) is formed by a MOCVD method. Then, it is subjected to a heat treatment in an ammonia ($NH_3$) atmosphere or a nitrogen plasma atmosphere.

The first and second gate insulating films 17 and 21 are formed to be high dielectric films. This provides an advantage that the gate insulating film can be increased in film thickness to suppress the gate leak current.

Particularly, $NiSi_2$ on a hafnium type insulating film has a smaller work function than that on the silicon oxide film. Therefore, it has an advantage of being capable of more reducing the threshold voltage of the NMOS transistor 15.

Further, in the above embodiment, an example is stated that the semiconductor substrate is the P-type silicon substrate 11. However, it is also possible to use a silicon germanium (SiGe)

substrate, a germanium (Ge) substrate, a SOI (Silicon On Insulator) substrate, other compound semiconductor substrate, or the like.

Although the present invention has been described heretofore with reference to the embodiment thereof, it is to be understood that the present invention is not limited to the above description and the drawings as a part of the disclosure. It goes without saying that the invention includes other various embodiments and modifications which have not been described in this specification.

What is claimed is:

1. A semiconductor device comprising:
    a P-type semiconductor layer formed in a surface region of a semiconductor substrate;
    a first gate insulating film formed on the P-type semiconductor layer;
    a first gate electrode including:
        a first silicide film formed directly on the first gate insulating film and containing nickel silicide having a first composition ratio of nickel to silicon as a main component;
        a conductive film formed on the first silicide film; and
        a second silicide film formed on the conductive film and containing nickel silicide having a second composition ratio of nickel to silicon which is larger than the first composition ratio as a main component; and
    a first source region and a first drain region formed in the P-type semiconductor layer to interpose a region under the first gate electrode in a direction of gate length.

2. The device according to claim 1, wherein the first silicide film contains $NiSi_2$ as the main component, and the second silicide film contains one of $NiSi$, $Ni_3Si$, $Ni_{31}Si_{12}$ and $Ni_2Si$ as the main component.

3. The device according to claim 1, wherein the conductive film contains one of titanium, tungsten, hafnium, ruthenium and an alloy that contains at least two of titanium, tungsten, hafnium and ruthenium.

4. The device according to claim 1, wherein the conductive film has a thickness of 3 to 10 nm.

5. The device according to claim 1, wherein the first silicide film has a thickness of approximately 5 nm.

6. The device according to claim 1, wherein the first gate insulating film contains one of a silicon oxide film, a silicon oxynitride film, a hafnium oxide film, a hafnium silicon oxide film, a hafnium silicon oxynitride film, a hafnium aluminum oxide film, and a hafnium aluminum oxynitride film.

7. A semiconductor device comprising:
    an N-channel insulated gate field effect transistor including:
        a P-type semiconductor layer formed in a surface region of a semiconductor substrate;
        a first gate insulating film formed on the P-type semiconductor layer;
        a first gate electrode including a first silicide film formed on the first gate insulating film and containing nickel silicide having a first composition ratio of nickel to silicon as a main component, a conductive film formed on the first silicide film, and a second silicide film formed on the conductive film and containing nickel silicide having a second composition ratio of nickel to silicon which is larger than the first composition ratio as a main component; and
        a first source region and a first drain region formed in the P-type semiconductor layer to interpose a region under the first gate electrode in a direction of gate length; and
    a P-channel insulated gate field effect transistor including:
        an N-type semiconductor layer formed to be isolated from the P-type semiconductor layer in the surface region of the semiconductor substrate;
        a second gate insulating film formed on the N-type semiconductor layer;
        a second gate electrode formed on the second gate insulating film and including a third silicide film containing nickel silicide having the second composition ratio approximately as a main component; and
        a second source region and a second drain region formed in the N-type semiconductor layer to interpose a region under the second gate electrode in a direction of gate length.

8. The device according to claim 7, wherein the first silicide film contains $NiSi_2$ as the main component, and each of the second silicide film and the third silicide film contains one of $NiSi$, $Ni_3Si$, $Ni_{31}Si_{12}$ and $Ni_2Si$ as the main component.

9. The device according to claim 7, wherein the conductive film contains one of titanium, tungsten, hafnium, ruthenium and an alloy that contains at least two of titanium, tungsten, hafnium and ruthenium.

10. The device according to claim 7, wherein the conductive film has a thickness of 3 to 10 nm.

11. The device according to claim 7, wherein the first silicide film has a thickness of approximately 5 nm.

12. The device according to claim 7, wherein each of the first gate insulating film and the second gate insulating film contains one of a silicon oxide film, a silicon oxynitride film, a hafnium oxide film, a hafnium silicon oxide film, a hafnium silicon oxynitride film, a hafnium aluminum oxide film, and a hafnium aluminum oxynitride film.

13. The device according to claim 7, wherein the first gate electrode and the second gate electrode have a substantially same thickness.

14. A method of manufacturing a semiconductor device comprising:
    forming a P-type semiconductor layer and an N-type semiconductor layer to be isolated from each other in a surface region of a semiconductor substrate;
    forming a first gate electrode including a first silicon film, a metal film, and a second silicon film stacked in this order on a first gate insulating film formed on the P-type semiconductor layer, and forming a second gate electrode including a third silicon film on a second gate insulating film formed on the N-type semiconductor layer;
    forming a first source region and a first drain region in the P-type semiconductor layer to interpose a region under the first gate electrode in a direction of gate length, and forming a second source region and a second drain region in the N-type semiconductor layer to interpose a region under the second gate electrode in a direction of gate length; and
    forming a nickel film on the second silicon film and the third silicon film and then performing a heat treatment to transform the first gate electrode for a transformed first gate electrode including a first silicide film having a first composition ratio of nickel to silicon, a conductive film, and a second silicide film having a second composition ratio of nickel to silicon which is larger than the first composition ratio, and to transform the second gate electrode for a transformed second gate electrode including a third silicide film having the second composition ratio approximately.

15. The method according to claim 14, wherein the metal film contains one of titanium, tungsten, hafnium, ruthenium and an alloy containing at least two of titanium, tungsten, hafnium and ruthenium.

16. The method according to claim 14, wherein the metal film is formed to have a thickness of 3 to 10 nm.

17. The device according to claim 14, wherein the first silicon film is formed to have a thickness of approximately 5 nm.

18. The method according to claim 14, wherein each of the first and second gate insulating films contains one of a silicon oxide film, a silicon oxynitride film, a hafnium oxide film, a hafnium silicon oxide film, a hafnium silicon oxynitride film, a hafnium aluminum oxide film, and a hafnium aluminum oxynitride film.

19. The method according to claim 14, wherein the first gate electrode and the second gate electrode are formed to have a substantially same thickness.

20. The method according to claim 14, wherein said forming the first gate electrode and the second gate electrode comprises:

forming a lower silicon film on the first gate insulating film and the second gate insulating film;

forming an intermediate metal film on the lower silicon film and above a region except the N-type semiconductor layer;

forming an upper silicon film on the intermediate metal film and on an exposed region of the lower silicon film;

removing the lower silicon film, the intermediate metal film and the upper silicon film except a region where the first gate electrode and the second gate electrode is to be formed, to form the first silicon film, the metal film, and the second and the third silicon films.

* * * * *